United States Patent
Nguyen et al.

(10) Patent No.: US 6,208,747 B1
(45) Date of Patent: Mar. 27, 2001

(54) DETERMINATION OF SCANNING ERROR IN SCANNER BY RETICLE ROTATION

(75) Inventors: Khanh B. Nguyen, San Mateo; Harry Levinson, Saratoga, both of CA (US)

(73) Assignee: Advanced Micro Devices Inc., Sunnyvale, CA (US)

( * ) Notice: Subject to any disclaimer, the term of this patent is extended or adjusted under 35 U.S.C. 154(b) by 0 days.

(21) Appl. No.: 09/203,240

(22) Filed: Dec. 1, 1998

(51) Int. Cl.$^7$ .................................................. G06K 9/00
(52) U.S. Cl. ........................... 382/100; 382/100; 382/144; 430/395
(58) Field of Search ................. 355/53, 67, 69; 382/100, 144; 430/5, 394, 395; 623/11; 438/107

(56) References Cited

U.S. PATENT DOCUMENTS

| | | | |
|---|---|---|---|
| 5,354,632 | * | 10/1994 | Dao et al. .................................. 430/5 |
| 5,534,970 | * | 7/1996 | Nakashima et al. .................... 355/53 |
| 5,602,619 | * | 2/1997 | Sogard .................................... 355/53 |
| 5,807,406 | * | 9/1998 | Brauker et al. ......................... 623/11 |
| 5,835,195 | * | 11/1998 | Gibson et al. .......................... 355/53 |
| 5,840,448 | * | 11/1998 | Borodovsky et al. ................... 430/5 |
| 5,879,866 | * | 3/1999 | Starikov et al. ...................... 430/395 |
| 5,892,524 | * | 4/1999 | Silverbrook ............................ 347/15 |
| 5,896,188 | * | 4/1999 | McCullough ........................... 355/67 |
| 5,905,020 | * | 5/1999 | Hu et al. ............................... 430/394 |
| 5,985,693 | * | 11/1999 | Leedy .................................... 438/107 |
| 6,069,684 | * | 5/2000 | Golladay et al. ....................... 355/53 |
| 6,097,474 | * | 8/2000 | McCullough et al. ................... 355/69 |

* cited by examiner

Primary Examiner—Matthew C. Bella
Assistant Examiner—M. Choobin
(74) Attorney, Agent, or Firm—Eschweiler & Associates, LLC

(57) ABSTRACT

A method (300) of characterizing a lithographic scanning system includes the steps of printing a first pattern (302) using a reticle (220) having a first orientation with respect to the lithographic scanning system and measuring a critical dimension of the first pattern at a plurality of points (310). The method (300) further includes printing a second pattern (320) using the reticle (220) having a second orientation with respect to the lithographic scanning system different than the first orientation and measuring a critical dimension of the second pattern at the plurality of points (322). The measured critical dimension data is then used to determine a reticle critical dimension component and a non-reticle critical dimension component of the patterns at the plurality of points (324) and a scanning system critical dimension component of the patterns is then determined using the non-reticle critical dimension component data along a plurality of points corresponding to a scanning direction of the lithographic scanning system (326).

9 Claims, 9 Drawing Sheets

DETERMINATION OF SCANNING ERROR IN SCANNER BY RETICLE ROTATION

FIELD OF THE INVENTION

The present invention generally relates to lithography tools and methods for using such tools, and more particularly relates to a method of characterizing a lithographic printer by distilling the reticle critical dimension components from the imaging system critical dimension components for characterization of lithographic printing systems.

BACKGROUND OF THE INVENTION

Lithography in semiconductor processing relates generally to the process of transferring patterns which correspond to desired circuit components onto one or more thin films which overlie a substrate. One important step within the field of lithography involves optical tools and methods for transferring the patterns to the films which overlie the semiconductor wafer. Patterns are transferred to a film by imaging various circuit patterns onto a photoresist layer which overlies the film on the wafer. This imaging process is often referred to as "exposing" the photoresist layer. The benefit of the exposure process and subsequent processing allows for the generation of the desired patterns onto the film on the semiconductor wafer, as illustrated in prior art FIGS. 1a–1f.

Prior art FIG. 1a illustrates a photoresist layer 10 deposited by, for example, spin-coating, on a thin film 11 such as silicon dioxide ($SiO_2$) which overlies a substrate 12 such as silicon. The photoresist layer 10 is then selectively exposed to radiation 13 (e.g., ultraviolet (UV) light) via a photomask 14 (hereinafter referred to as a "mask") to generate one or more exposed regions 16 in the photoresist layer 10, as illustrated in prior art FIG. 1b. Depending on the type of photoresist material utilized for the photoresist layer 10, the exposed regions 16 become soluble or insoluble in a specific solvent which is subsequently applied across the wafer (this solvent is often referred to as a developer).

When the exposed regions 16 are made soluble, a positive image of the mask 14 is produced in the photoresist layer 10, as illustrated in prior art FIG. 1c, and the photoresist material is therefore referred to as a "positive photoresist". The exposed underlying areas 18 in the film 11 may then be subjected to further processing (e.g., etching) to thereby transfer the desired pattern from the mask 14 to the film 11, as illustrated in prior art FIG. 1d (wherein the photoresist layer 10 has been removed). Conversely, when the exposed regions 16 are mode insoluble, a negative image of the mask 14 is produced in the photoresist 10 layer, as illustrated in prior art FIG. 1e, and the photoresist material is therefore referred to as a "negative photoresist." In a similar manner, the exposed underlying areas 20 in the film 11 may then be subjected to further processing (e.g., etching) to thereby transfer the desired pattern from the mask 14 to the film 11, as illustrated in prior art FIG. 1f.

The transfer of patterns to the photoresist layer 10 as discussed above involves the use of optical aligners. Optical aligners are machines which contain a variety of subsystems that work together to form the imaging function. Such optical aligners include: (1) an illumination source which provides the optical energy (UV light in the above example) for transforming the photoresist via exposure, (2) an optical subsystem that focuses the circuit patterns onto the photoresist surface and allows for controlled exposure times, and (3) a movable stage that holds the wafer being exposed.

Historically, three primary methods have been used to optically transfer a mask pattern to a photoresist covered film. These methods include: contact printing, proximity printing and projection printing and are illustrated in simplified form in prior art FIGS. 2a–2d, respectively. Contact printing 100, as illustrated in prior art FIG. 2a, was the earliest method used to produce patterns. Contact printing 100 involves a light source 112, an optical system 114, a mask 116 and a photoresist layer 118 overlying a thin film which, in turn, overlies a semiconductor wafer 120. The mask 116, which contains the desired circuit patterns for transfer to the photoresist layer 118, is positioned (aligned) relative to any existing patterns that already exist on the wafer 120. The mask 116 is then clamped down to the photoresist layer 118, thereby making physical contact with the photoresist layer 118, and exposed with ultraviolet (UV) light from the light source 112. This method provides for an excellent image transfer and good resolution (e.g., good minimum linewidth spacing).

Contact printing, however, suffers from the direct contact made between the mask 116 and the photoresist layer 118. The repeated contact made between the mask 116 and the photoresist layer 118 in the process results in defects generated in the mask 116 which are in turn transferred to subsequently processed wafers. To prevent this problem, the masks 116 must be inspected and cleaned regularly which can be disadvantageous in terms of cost and processing time. In addition, small particles may be caught between the mask 116 and the photoresist layer 118 when affixing the two elements, thereby preventing the desired direct contact between the mask 116 and the photoresist layer 118. This particulate contamination results in reduced resolution in the area local to the foreign particle. Consequently, contact printing is not common in VLSI semiconductor manufacturing.

Proximity printing 122, as illustrated in prior art FIG. 2b, involves placing the mask 116 near the wafer 120 (which is covered with the photoresist 118) during exposure, however, the mask 116 and the wafer 120 do not make contact. By introducing a gap 124 between the mask 116 and the wafer 120, the defect problem of contact printing is substantially avoided. Unfortunately, as the gap 124 increases, the resolution of the proximity printing system 122 rapidly deteriorates. For example, a 10 μm gap with a 400 nm exposure (the wavelength of the light source 112) results in a minimum resolution of about 3 μm. In addition, proximity printing 122 requires extremely flat masks 116 and wafers 120 in order to prevent gap variations spatially about the wafer 120. Since many VLSI semiconductor circuits today require features of 0.25 μm or less, proximity printing 122 is not considered adequate for many VLSI semiconductor manufacturing operations.

Projection printing is a generic term that encompasses various pattern transfer techniques. These techniques, for example, include: (a) projection scanning systems, (b) reduction (e.g., 4× or 10×) step-and-repeat projection systems, and (c) reduction step-and-scan systems. In each system, lens elements or mirrors are used to focus the mask image on the wafer surface (containing the photoresist).

Projection scanning systems (often called scanning projection aligners), use a reflective spherical mirror (reflective optics) to project an image onto the wafer surface, as illustrated, for example, in prior art FIG. 2c. The system 126 includes a primary mirror 128 and a secondary mirror 129 which are arranged with the mask 116 and the wafer 120 to image the mask pattern onto the photoresist layer 118 which overlies the film on the wafer 120 (the photoresist layer 118 and the thin film are not shown in FIG. 2c for simplicity). A narrow arc of radiation is imaged from the mask 116 to the wafer 120 through a slit with light that travels an optical path that reflects the light multiple times. The mask 116 and the wafer 120 are scanned through the arc of radiation by means of a continuous scanning mechanism (not shown). The scanning technique minimizes mirror distortions and aberrations by keeping the imaging illumination in the "sweet spot" of the imaging system 128 and 129.

Reduction step-and-repeat systems 130 (also called reduction steppers) use refractive optics (as opposed to reflective optics in the system 126 of prior art FIG. 2c) to project the mask image onto the photoresist layer 118 which overlies the film on the wafer 120, as illustrated, for example, in prior art FIG. 2d. The reduction stepper 130 includes a mirror 132, a light source 134, a filter 136, a condenser lens system 138, a reticle 140, a reduction lens system 142 and the wafer 120. The mirror 132 behaves as a collecting optics system to direct as much of the light from the light source 134 (e.g., a mercury-vapor lamp) to the wafer 120. The filter 136 is used to limit the light exposure wavelengths to the specified frequencies and bandwidth. The condenser system 138 focuses the radiation through the reticle 140 and to the reduction lens system to thereby focus a "masked" radiation exposure onto a limited portion of the wafer 120, namely onto a single semiconductor die 144.

Since it is complex and expensive to produce a lens capable of projecting a mask pattern of an entire 150 mm or 200 mm wafer, the refractive system 130, as illustrated in prior art FIG. 2d, projects an image only onto a portion of the wafer 120 corresponding to an individual semiconductor die 144. This image is then stepped and repeated across the wafer 120 in order to transfer the pattern to the entire wafer (and thus the name "steppers"). Consequently, the size of the wafer is no longer a consideration for the system optics.

The reduction stepper system 130 thus uses the reticle 140 instead of a mask. Reticles are similar to masks, but differ in that a mask contains a pattern for transfer to the entire wafer in one exposure while a reticle contains a pattern image for a single or several semiconductor die that must be stepped and repeated across the wafer 120 in order to expose the entire wafer substrate. Today, the term "mask" and "reticle" are used interchangeably and will be used interchangeably hereinafter. Current reduction stepper systems such as the system 130 utilize reticles that contain a pattern that is an enlargement of the desired image on the wafer 120. Consequently, the reticle pattern is reduced when projected onto the wafer 120 during exposure (and thus the name "reduction stepper").

Steppers are typically evaluated by measuring the critical dimension of a feature produced by the stepper. A critical dimension is typically defined as the absolute size of a minimum feature, including the feature linewidth and feature spacing. The resulting critical dimension of a feature measured on the wafer is a function of the critical dimension contributions or components provided by the stepper and the reticle. Thus, to characterize a stepper being used as a lithographic printer, it is desirable to separate out the critical dimension components attributable to the reticle from critical dimension components which are attributable to the imaging system. In this manner, variations in the critical dimension of features across a die can be properly attributed either to the reticle or to the imaging system of the stepper. With such distilled information, the reticle or the imaging system (or both) can be properly characterized.

Variations in the critical dimension due to the reticle are sometimes caused by reticle fabrication defects. Such defects include, for example, bubbles, scratches, pits and fractures of the reticle glass substrate. Additional defects may include chrome defects such as particulate inclusions in the film, pinholes or voids in the chrome surface and invisible chemical anomalies which lead to erratic local etching. Still additional defects may be caused by resist defects such as voids which produce pinholes that lead to chrome spots. Furthermore, critical dimension variations are also due to variations in the process conditions during the exposure and development process such as variations in the exposure dose, development rate, and temperature.

Various techniques and inspection tools exist and are used to verify whether a fabricated reticle meets the minimum required quality specifications. Such inspection tools typically utilize the transmission of light using an automated defect detection system. Although these tools can separate out unacceptable reticles which fail to meet the required minimum specifications, these tools do not characterize the variations in the reticle which give rise to variations in the critical dimension of patterned features across the die. Thus, such inspection tools do not aid in accurately characterizing the performance of the reticle or the stepper system as a whole.

In addition to stepper systems, scanning step and repeat systems 150 (often called "step and scan systems") have become popular, as illustrated in a simplified, exemplary prior art FIG. 3. Step and scan systems differ from the scanning system of FIG. 2c because instead of the entire wafer being scanned with a mask, each die on the wafer is scanned with a reticle and the system then steps across the wafer and scans each die across the wafer. In prior art FIG. 3, a reticle and substrate subsystem 152 are positionally fixed with respect to one another, and the reticle/substrate subsystem 152 are laterally scanned in the X-direction across a slit 154 in the imaging system 156 by laterally moving the subsystem 152. Consequently, in the step and scan system 150, the entire reticle field is not printed at one time, but rather the portion of the reticle field underneath the slit 154 is printed and the slit 154 is scanned across the reticle field by the lateral movement of the reticle/substrate subsystem 152. In the above manner, the exposed portion of the reticle field is always within the same fixed portion of the image field in order to maintain the printing within the "sweet spot" of the imaging optics.

Although step and scan systems constitute an improvement in pattern transfer quality, the scanning process can contribute to pattern transfer errors (and thus variations in the critical dimension along the scan direction (e.g., the X-direction)) if the subsystem 152 positioning is not proper for each scan. For example, if the repeated scans of the subsystem 152 (containing the wafer and reticle) past the slit 154 are crooked or misaligned or the position of the subsystem 152 is rotated slightly from its desired position in the "X-Y" plane, errors may be generated in the transferring of the reticle pattern to the wafer. Furthermore, scanning instability can lead to errors in pattern transfer. In addition, the scanning errors are independent of, and in addition to, the critical dimension variations discussed above with respect to the reticle and the imaging system. Again, as designers wish to make further developments in both the printing systems and the reticles, it is desirable to identify separately the critical dimension contributions associated with the printer (non-reticle contributions) from the critical dimension contributions associated with the reticle in order to accurately characterize the printing system.

Therefore there is a need in the art for a method of separating reticle critical dimension components from printing system critical dimension components in lithographic printing systems.

SUMMARY OF THE INVENTION

The present invention relates to a method of characterizing a lithographic printer such as a reduction stepper by identifying the critical dimension contributions or components provided by the reticle and the imaging system of the lithographic printer. The critical dimension components are determined by measuring a critical dimension of a pattern on a wafer at two points, wherein the pattern is formed using a reticle at a first reticle rotation. Another critical dimension of a second pattern is measured at the same two points, wherein the second pattern is formed using the reticle at a second reticle rotation. The two sets of measurements provides a four (4) equation, four (4) unknown degenerate linear system. By taking a reticle measurement at either one of the two points, a three equation, three unknown system is established which can be uniquely solved to identify the stepper and reticle critical dimension contributions at the two points, respectively. The present invention may be extended to multiple points on the reticle to thereby characterize the lithographic printer at multiple points within the image field and reticle field as may be desired. The present invention thus allows one to decouple the critical dimension contribution of the stepper from the reticle critical dimension contribution so that development of each system component (e.g., the reticle and the imaging system) may be properly evaluated.

According to another aspect of the present invention, a method of characterizing a lithographic scanning step and repeat system includes identifying the critical dimension contributions of both the reticle and the non-reticle portion of the system. The reticle critical dimension contribution and the non-reticle contribution are determined by measuring a critical dimension of a wafer pattern at two points, wherein the pattern is formed using a reticle at a first reticle rotation. A critical dimension of another pattern, which is formed using the reticle at a second reticle rotation, is then measured at the two points. The two sets of measurements provides a four (4) equation, four (4) unknown degenerate linear system. By taking a single reticle measurement at either one of the two points, a three equation, three unknown system is established which can be uniquely solved to identify the reticle and non-reticle critical dimension contributions at the two points, respectively. The present invention may be extended to many points on the reticle to thereby characterize the lithographic printer at varying levels of accuracy across the image field as may be desired.

Once the non-reticle critical dimension contribution is identified across the image field, the individual components which make up non-reticle critical dimension contribution can be further distilled: namely the imaging system contribution (the lens) and the contribution due to the scanning process. Since the variation in the non-reticle critical dimension component along the scan direction is due to the non-lens variations because the same portion of the lens is utilized along the scan direction, the lens or imaging system component of the critical component is the average of the non-reticle critical dimension contribution along the scan direction while the variation in the non-reticle critical dimension along the scanning direction is attributable to the scanning related error. Thus by evaluating the non-reticle critical dimension contribution data along the scanning direction (e.g., by calculating the average and the standard deviation of the non-reticle critical dimension contribution along the scanning direction), the contributions of both the imaging system and the scanning system to the non-reticle critical dimension can be determined.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
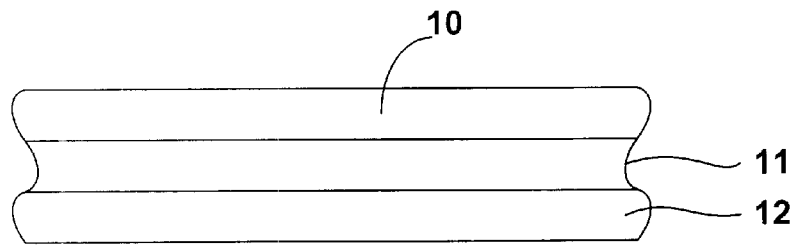
FIG. 1a is a fragmentary cross section illustrating a prior art semiconductor substrate having a film overlying the substrate which in turn is covered by a photoresist layer.
Figure 1B:
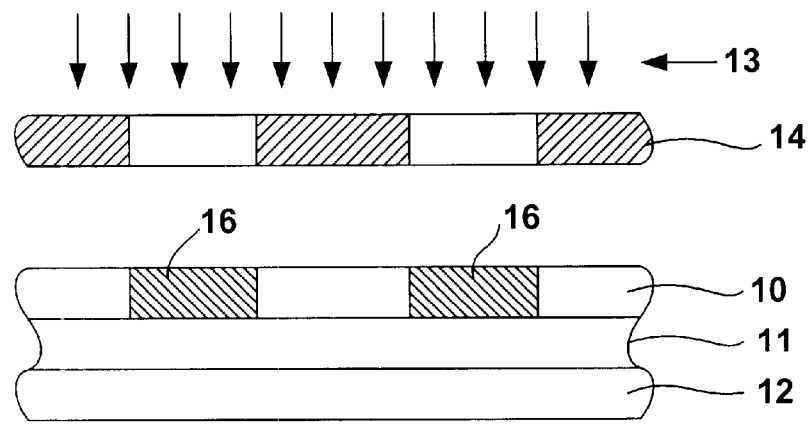
FIG. 1b is a fragmentary cross section illustrating a prior art method of selectively exposing a photoresist layer using a mask.
Figure 1C:
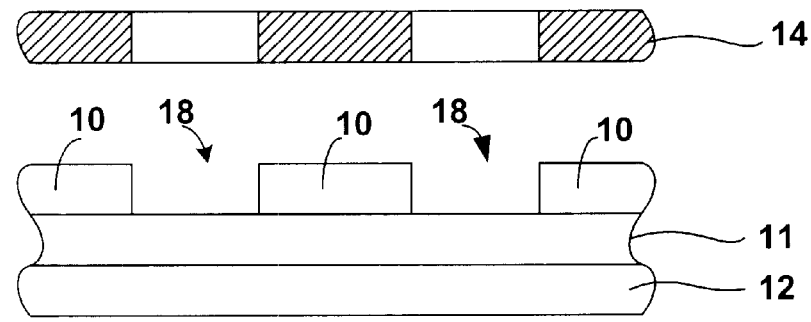
FIG. 1c is a fragmentary cross section illustrating a positive photoresist layer after being developed.
Figure 1D:
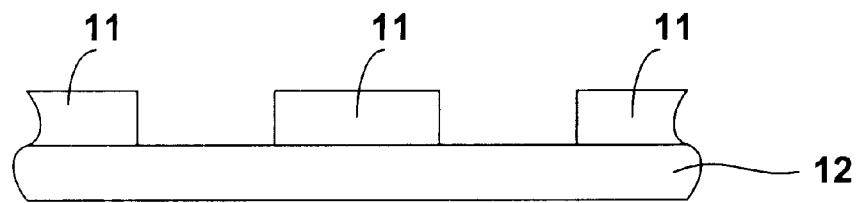
FIG. 1d is a fragmentary cross section illustrating a transfer of a mask pattern to the film.
Figure 1E:
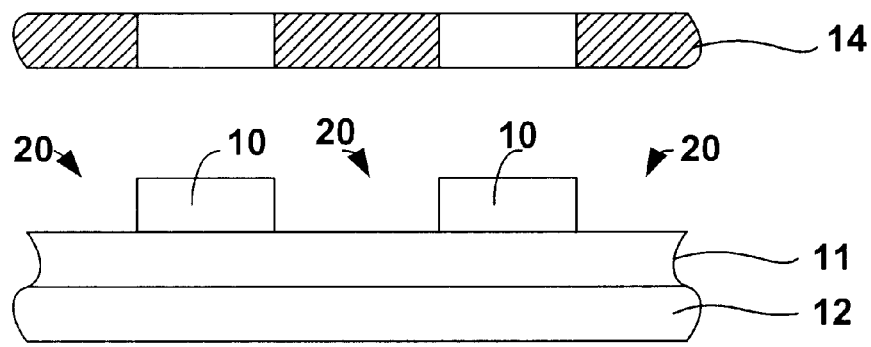
FIG. 1e is a fragmentary cross section illustrating a negative photoresist layer after being developed.
Figure 1F:
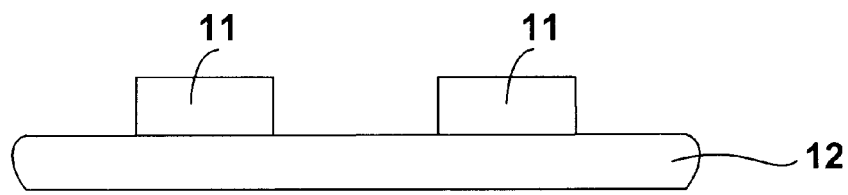
FIG. 1f is a fragmentary cross section illustrating a transfer of a mask pattern to the film.
Figure 2A:
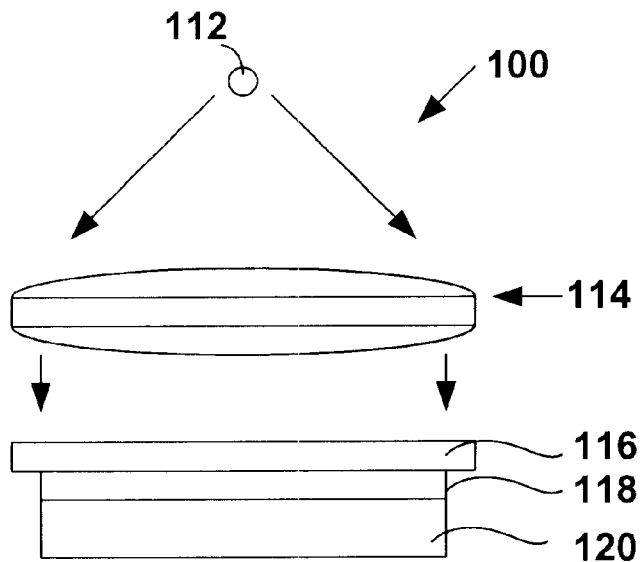
FIG. 2a is system view of a prior art contact printing system wherein a mask physically contacts the wafer during transfer of a pattern to the wafer.
Figure 2B:
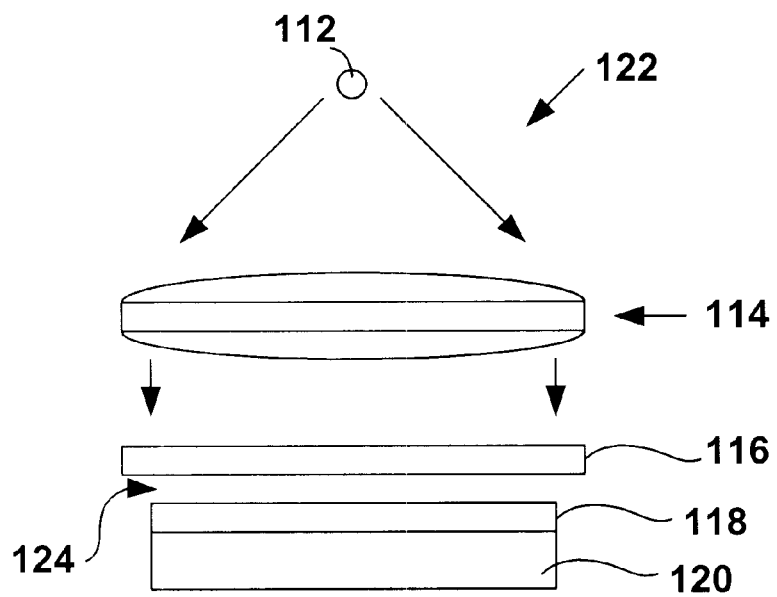
FIG. 2b is a system view of a prior art proximity printing system wherein a mask is separated from the underlying wafer by a gap during transfer of a pattern to the wafer.
Figure 2C:
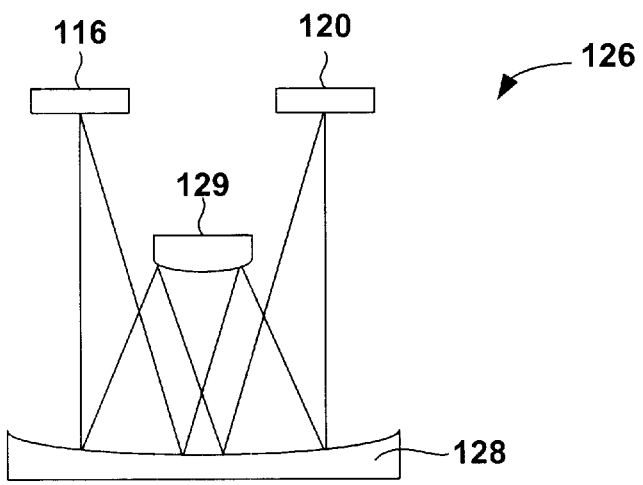
FIG. 2c is a system view of a prior art scanning projection system wherein reflective optics are used to transfer a pattern to the wafer.
Figure 2D:
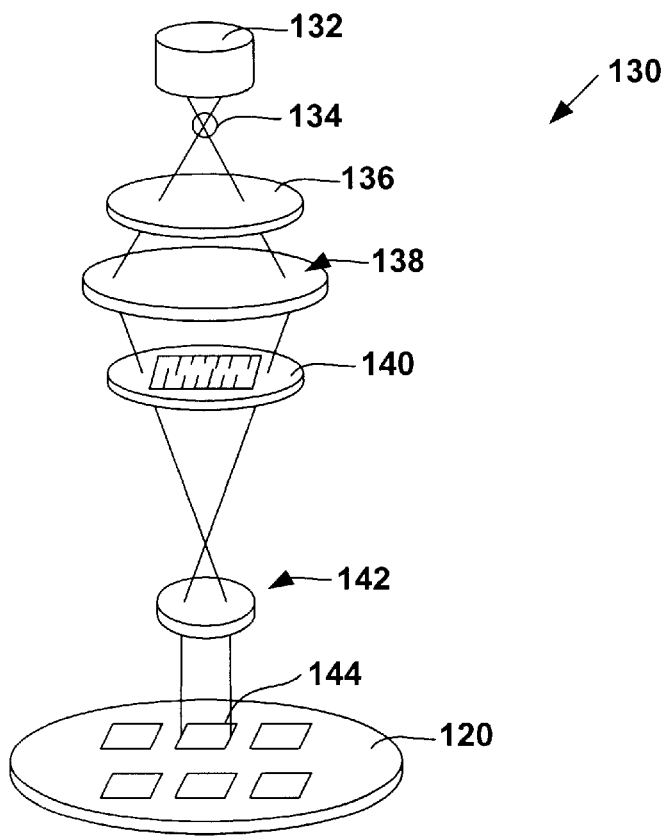
FIG. 2d is a system view of a prior art reduction stepper wherein refractive optics are used to transfer a pattern to a localized region on the wafer.
Figure 3:
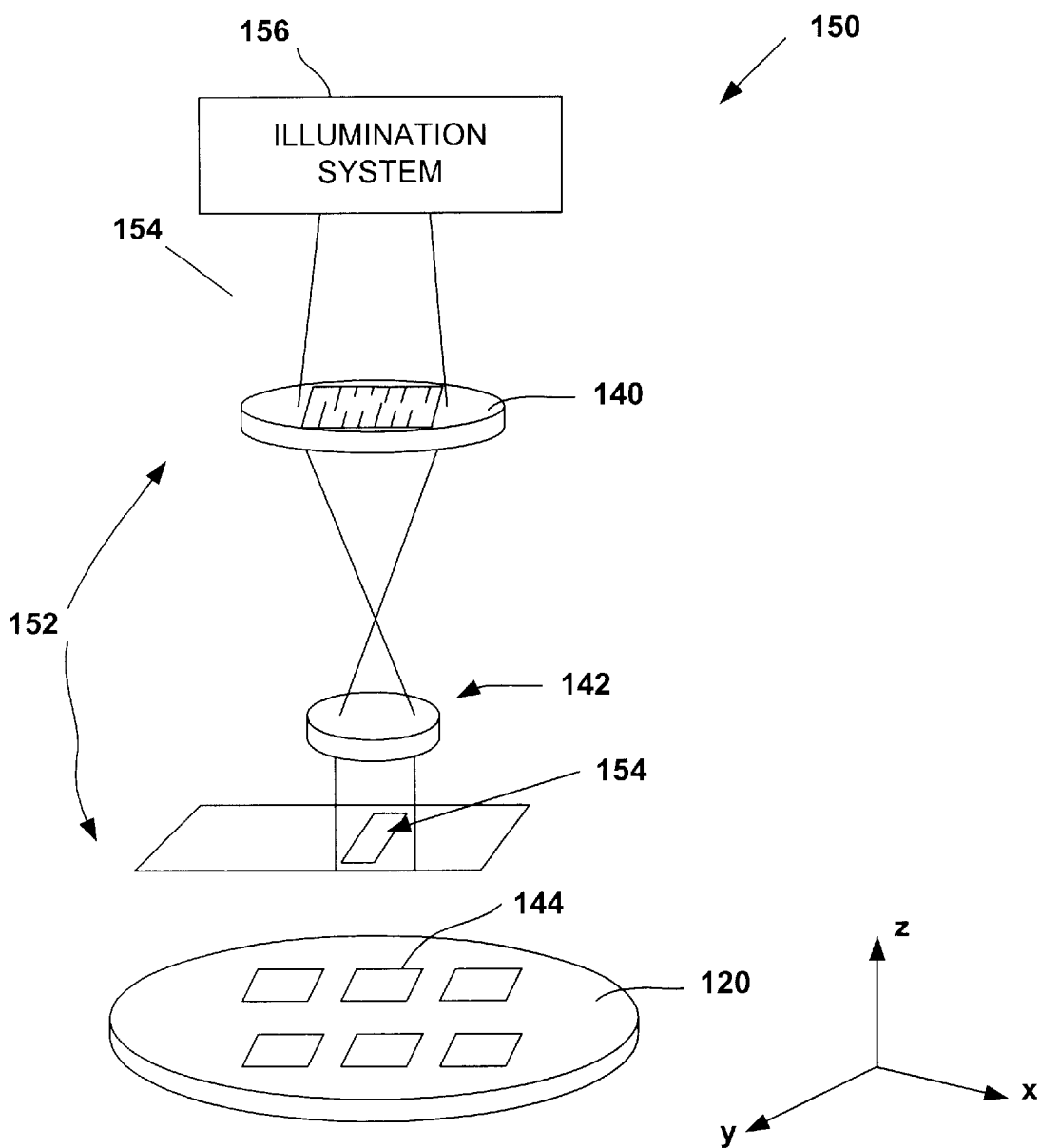
FIG. 3 is a system view of a prior art scan and repeat system wherein a reticle pattern is imaged to a substrate through a slit which is scanned across the image field by moving the reticle and substrate past the illuminated slit.

The following is a detailed description of the present invention made in conjunction with the attached Figures, wherein like reference numerals will refer to like elements throughout. The present invention includes a method of characterizing a lithographic printing system by identifying the various components which make up the critical dimension of a pattern on a substrate. In the past, it was not certain to what extent the reticle and the imaging system which were used in the printing process contributed to the total critical dimension of the produced features. Consequently, monitoring the development and characterizing the various components within the printing process was difficult. The present invention overcomes the disadvantages of the prior art by identifying both the reticle critical dimension contribution from the imaging system critical dimension contribution for characterization of the lithographic printing system.

The reticle and imaging system contributions to the critical dimension of a feature produced on a substrate are distilled from one another by forming a pattern on a substrate using a reticle having a first rotational position with respect to the imaging system. The resulting pattern is then measured at two points on the substrate. Subsequently, a second pattern is generated using the same reticle at a second rotational position with respect to the imaging system (different from the first rotational position) and the resultant second pattern is measured at the same two points. The two pairs of measurements provide a four equation, four unknown degenerate linear equation system. A single reticle measurement is then taken at either one of the two points, thus providing a three equation, three unknown system which may be uniquely solved to identify both the reticle and imaging system critical dimension components at the two points. The invention may then be extended to additional points across the reticle field and the image field to provide for a characterization of the reticle and imaging system across the entire reticle field and image field, respectively, as may be desired.

With regard to a step and repeat scanning system, the reticle and non-reticle contributions to the critical dimension of a pattern measured on a substrate are distilled from one another in a manner similar to the one described above. Due to the nature in which the pattern is produced in a scanning system, the non-reticle contribution to the critical dimension has two sub-components: an imaging system component and a scanning system component. The present invention appreciates that for a scan across the reticle field, a horizontal region along the scan direction interfaces with the same portion of the imaging system. Thus, variations in the non-reticle component of the critical dimension detected along a horizontal scan are not a function of the imaging system and can therefore be attributed to variations within the scanning system. Consequently, according to the present invention, a constant component of the non-reticle critical dimension component across a horizontal scan is attributable to the imaging system while the variation in the non-reticle critical dimension component across the horizontal scan (which may be expressed, for example, in terms of a standard deviation) is attributable to the scanning system. Therefore according to the present invention, the reticle component, the imaging system component and the scanning system component of a resultant feature critical dimension can each be separately characterized.

Figure 4:
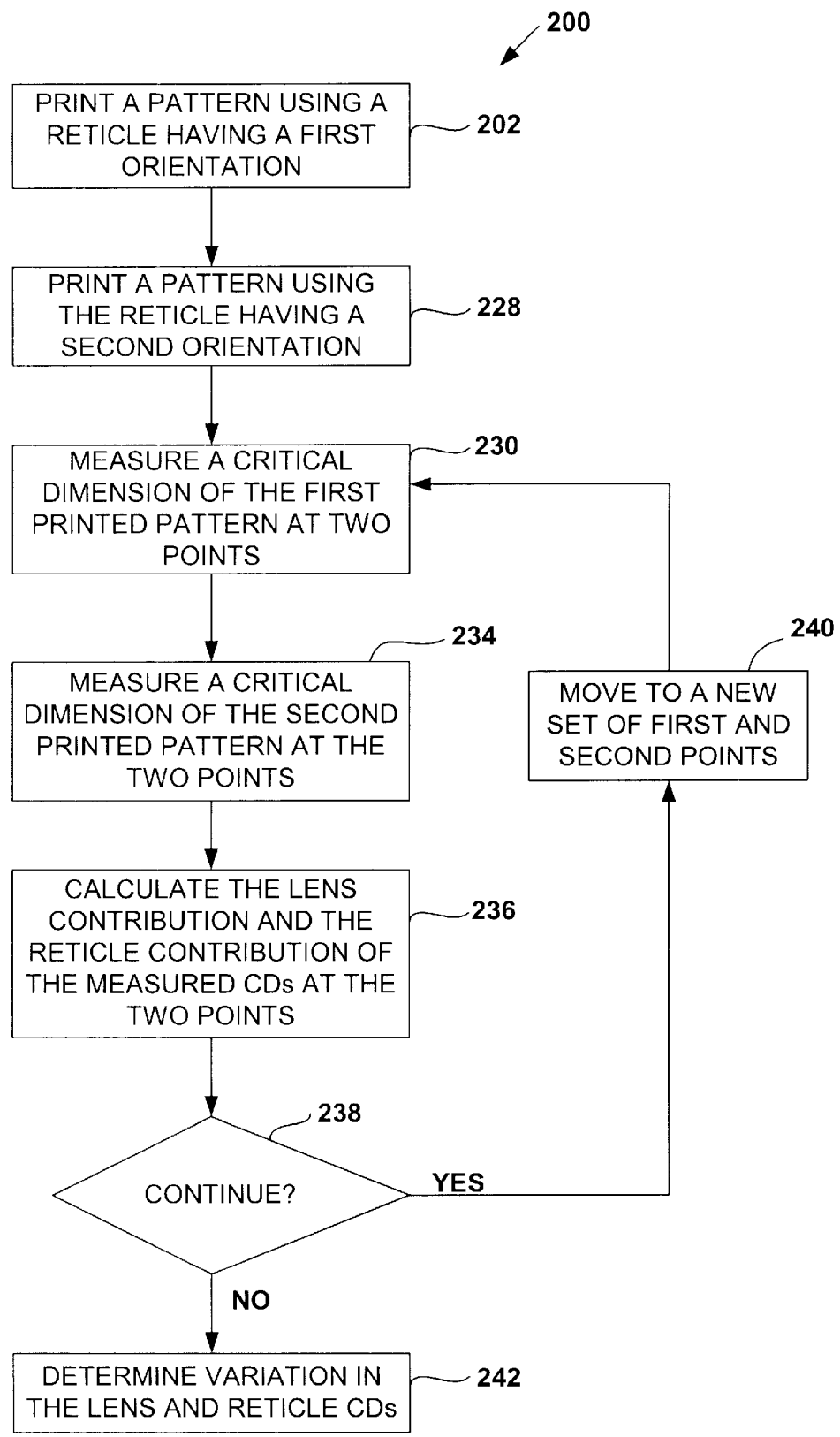
FIG. 4 is a flow chart illustrating a method of characterizing a lithographic printer according to the present invention.
Figure 5:
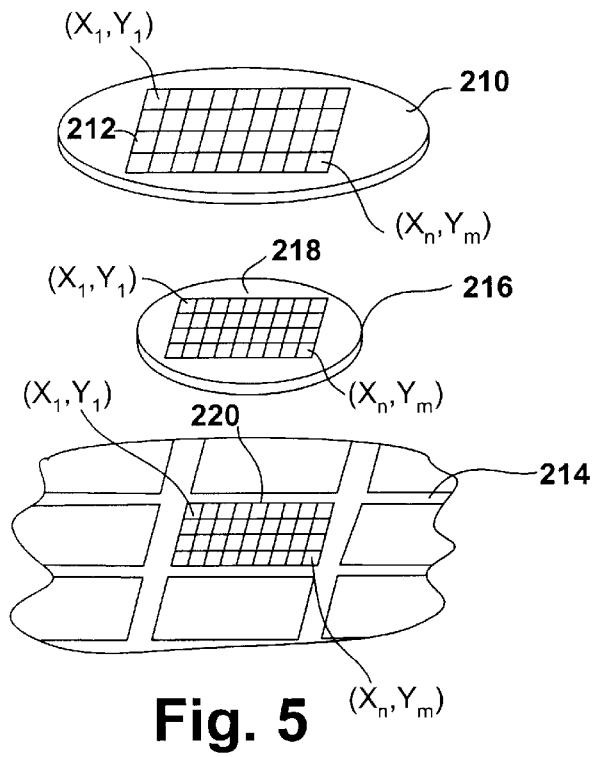
FIG. 5 is a perspective view of a reticle, lens and substrate highlighting a point in the reticle field corresponds to a point in the image field and on the substrate according to the present invention.

Turning now to the Figures, FIG. 4 is a flow chart illustrating a method 200 of characterizing a lithographic printer such as a stepper. The method 200 begins with the printing of a pattern onto a substrate using a reticle having a first orientation at step 202. This printing step is illustrated in greater detail in FIG. 5 and FIG. 6a. In FIG. 5, a reticle 210 has a pattern portion 212. The pattern portion 212 of the reticle 210 contains a pattern (not shown) which is to be transferred to a substrate 214 via an imaging lens 216. The pattern portion 212 is separated into a grid of individual regions $(X_l, Y_l), \ldots (X_n, Y_m)$ for characterization purposes. Each of the grid regions $(X_i, Y_j)$ represent a characterization point in the reticle field. According to a preferred embodiment of the present invention, the grid is 5×5, however, the number of points may be increased or decreased as desired to customize the characterization resolution.

The pattern of the reticle 210 is transferred to the substrate 214 via the imaging system such as the lens 216. The lens 216 has an image field 218 which is represented in FIG. 5 as a grid which corresponds to the pattern portion 212 of the reticle 210. Thus a portion of the image field 218 $(X_i, Y_j)$ corresponds to a portion in the reticle field $(X_i, Y_j)$. The reticle pattern is transferred to the substrate 214 on a single die 220. Each portion of the die $(X_l, Y_l), \ldots (X_n, Y_m)$ corresponds to a similar point in the image field and reticle field, respectively, so that $(X_i, Y_j)$ of each element corresponds to one another, as illustrated in FIG. 5.

Figure 6A:
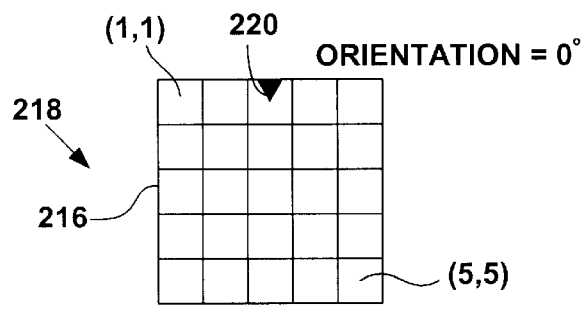
FIG. 6a is a plan view of a reticle having a first rotational orientation according to the present invention.
Figure 6B:
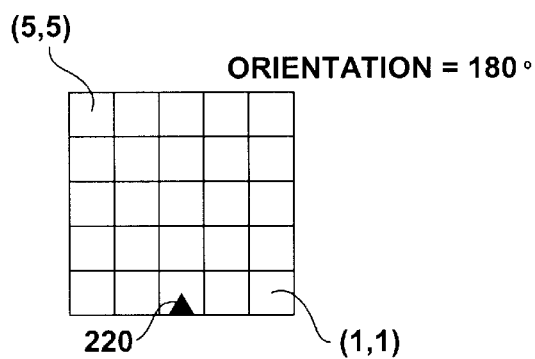
FIG. 6b is a plan view of the reticle of FIG. 6a having a second rotational orientation according to the present invention.

FIG. 6a illustrates the grid portion 218 of the reticle 210 in a first orientation (e.g., an orientation of 0° rotation). A hatch mark 220 is illustrated on the reticle 210 in FIG. 6a to illustrate the reticle orientation. Returning to FIG. 4, the method 200 continues by printing a pattern using the same reticle 210 on another substrate, wherein the reticle 210 is rotated to a second orientation, at step 228. The pattern transfer process occurs in a manner similar to that described in step 202 and illustrated in FIG. 5, except that the reticle 210 is rotated to a second orientation, such as that illustrated in FIG. 6b, where the reticle is rotated 180° with respect to the first reticle orientation illustrated in FIG. 6a. According to a preferred embodiment of the present invention, the reticle rotation is 180° (½ turn), however, other rotations are contemplated as falling within the scope of the present invention. The pattern on the reticle 210 which is transferred to the substrate 214 should, however, be rotationally symmetric so that the reticle pattern will be the same at a single point $(X_i, Y_j)$ at both the first and second reticle rotation (e.g., $(1,1)_{0°}$ and $(1,1)_{180°}$ as illustrated in FIGS. 6a and 6b). The value of having rotational symmetry of the reticle pattern will be more fully appreciated in conjunction with the discussion of calculating the critical dimension components which make up the critical dimension of the patterns which will be discussed in detail infra.

Once the reticle pattern is transferred to the substrates at steps 202 and 228, the critical dimension of the first pattern (or feature) is measured at two points at step 230 such as (1,1) and (5,5) (i.e., the top left and bottom right corners on the die 220). Feature measurements may be accomplished using various techniques such as using a scanning electron microscope, an optical microscope, or taking an electrical measurement (depending on the nature of the resultant film, e.g., a polysilicon film). For example, a current may be forced through the resultant pattern and a voltage can be measured across a portion of the pattern or the entire pattern. Using the forced current and measured voltage values, a resistance of the pattern can be determined which is a function of the critical dimension of the pattern or feature. Alternatively, however, other measurement techniques may be utilized and are contemplated as falling within the scope of the present invention.

After the first pattern is measured at two points at step 230, the second pattern which was generated using the reticle 210 oriented in a second orientation is measured at the same two points (e.g., (1,1) and (5,5)) at step 234 in a manner similar to step 230 discussed supra. The critical dimension data collected at steps 230 and 234 (e.g., CD(1, 1)$_{0°}$, CD(5,5)$_{0°}$, CD(1,1)$_{180°}$ and (CD(5,5)$_{180°}$) is then utilized at step 236 to calculate the lens or imaging system critical dimension contribution and the reticle critical dimension contribution at the two points (1,1) and (5,5) and thus identify the two contributions which dictate the critical dimension of the generated features on the substrate at those two points. The distillation of the two components of the critical dimension (i.e., the lens component $L(X_i,Y_j)$ and the reticle component $R(X_i,Y_j)$) is performed as follows.

The critical dimension measurement data collected at steps 230 and 234 represent four pieces of data with which a four equation, four unknown system may be generated, thus allowing the four unknown variables (the lens and reticle contributions) to be determined. CD(1,1)$_{0°}$, which was measured at step 230, is made up of the following unknown components: L(1,1), which is the lens critical dimension contribution at point (1,1), and R(1,1), which is the reticle critical dimension contribution at point (1,1). Thus CD(1,1)$_{0°}$=L(1,1) +R(1,1). Similarly, CD(1,1)$_{180°}$, which was measured at step 234, is made up of the following unknown components: L(5,5), since the lens system is fixed in the stepper system (see FIG. 6b), and R(1,1) because the reticle 210 was rotated 180° thus the reticle position R(1,1) which was at point (1,1) is now at position (5,5) after being rotated. Thus CD(1,1)$_{180°}$=L(5,5)+R(1,1). Likewise, CD(5, 5)$_{0°}$, which was measured at step 230, is made up of L(5,5) and R(5,5) and CD(5,5)$_{180°}$, which was measured at step 234, is made up of L(1,1) and R(5,5). Therefore the equations are:

$$CD(1,1)_{0°}=L(1,1)+R(1,1),$$

$$CD(1,1)_{180°}=L(5,5)+R(1,1),$$

$$CD(5,5)_{0°}=L(5,5)+R(5,5),$$

and $$CD(5,5)_{180°}=L(1,1)+R(5,5).$$

As is well known by those skilled in the art, a four equation, four unknown system may be solved for each unknown. The above linear system, however, is degenerate. That is, a single, unique solution does not exist, rather numerous solutions may be found which satisfy the above criteria. Therefore in order to obtain a single, unique solution, a single reticle measurement is made at one of the two points (i.e., (1,1) or (5,5)). Therefore, having obtained one of the pieces of reticle data via a measurement, the remaining system has three equations and three unknowns which is not degenerate and a single, unique solution may be found. For example, if R(1,1) is determined via a measurement, then L(1,1) can be determined from equation 1 above, which then can be used to determine R(5,5) via equation 4 and lastly, L(5,5) can then be determined by either equation 2 or 3. In the above manner the unknowns L(1,1), R(1,1), L(5,5) and R(5,5) are determined, respectively. Therefore by taking a single reticle measurement at either one of the two points, the lens and reticle contributions at the two points can be readily determined, thus decreasing the number of reticle measurements over prior art characterization methods by a factor of two (2). Thus according to the present invention the critical dimension contributions of the imaging system (lens) and the reticle at the two points ((1,1) and (5,5)) are determined at step 236.

The method 200 of FIG. 4 then continues at step 238, wherein a query is made whether the critical dimension contributions of the lens and reticle are to be determined at another pair of points. If the determination is in the affirmative (YES), then another set of points which are rotationally symmetric to one another (e.g., (2,1) and (4,5) or (1,2) and (5,4)) are selected at step 240 and the critical dimension of the features at those two points are measured for both printed patterns (printed with the different reticle rotations, respectively). Alternatively, instead of performing steps 230–236 two points at a time, a plurality of points can be measured at steps 230 and 234 and then the lens/reticle critical dimension contributions can collectively be determined at step 236.

Once either all the points or a selected number of points have been measured and their associated lens critical dimension contributions and reticle critical dimension contributions are calculated and no further calculations are to be performed (NO at step 238), the collected data may then be utilized to separately characterize the reticle and imaging system, respectively, at step 242. This step may include any number of characterization methodologies and each is contemplated as falling within the scope of the present invention. For example, one may utilize the lens imaging system data (L(1,1) . . . L(5,5)) to calculate the average and standard deviation of the data to characterize the quality of the imaging system across the entire image field. Alternatively, for example, different reticle fabrication processes may be characterized to see which type of reticle provides the minimum critical dimension or the least amount of critical dimension variation across the reticle.

Figure 7:
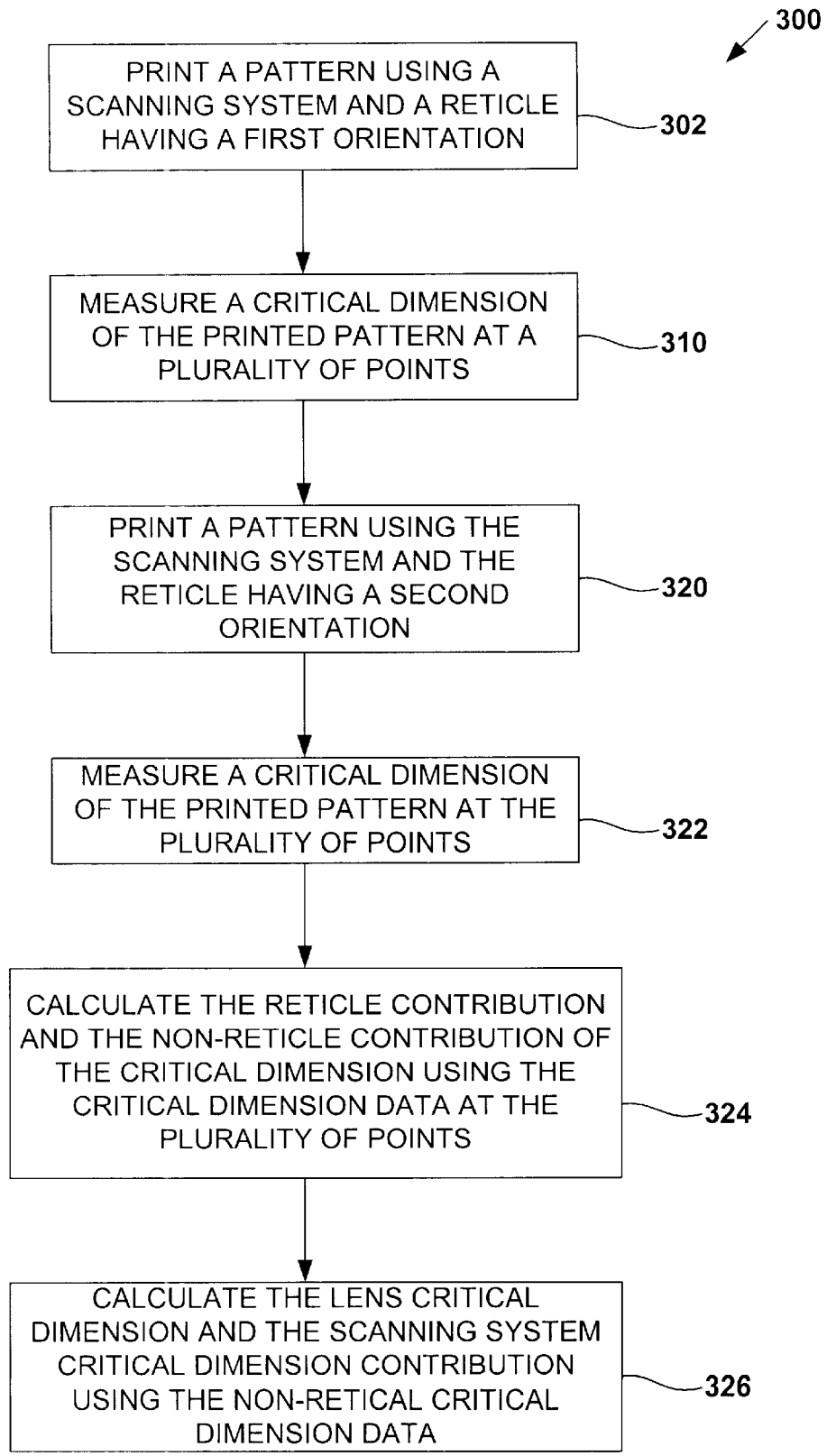
FIG. 7 is a flow chart diagram illustrating a method of characterizing a scanning system according to the present invention.
Figure 8:
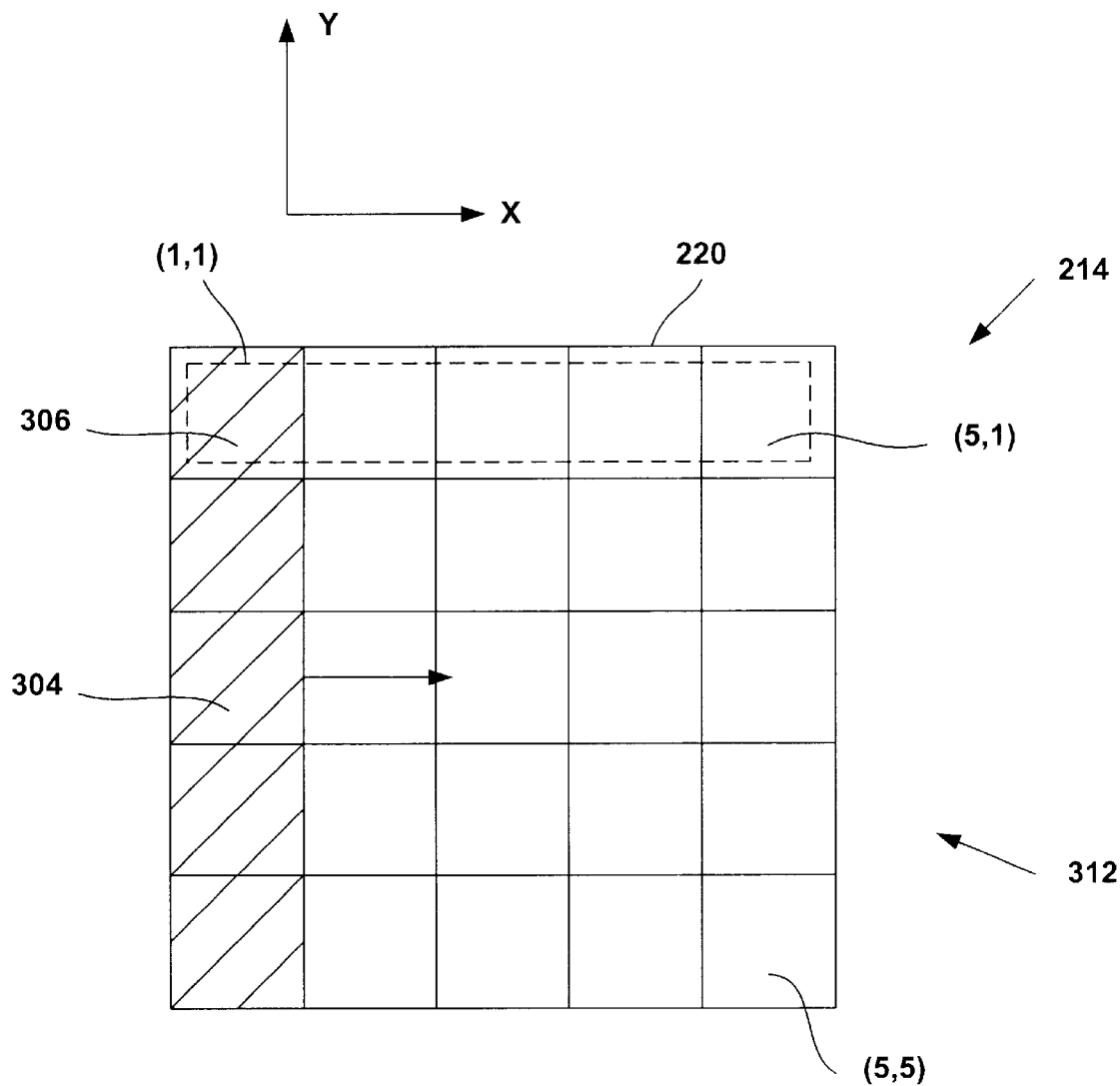
FIG. 8 is a plan view of the image plane showing a motion of the scanning slit with respect to the reticle and the substrate when the reticle and substrate are moved with respect to the scanning slit.

According to another embodiment of the present invention, a method of characterizing a scanning lithography system such as a scan and repeat system is disclosed. A flow chart illustrating such a method is illustrated in FIG. 7 at reference numeral 300. In the method 300, a pattern is printed using the scanning system and a reticle having a first orientation (e.g., 0°) at step 302. The printed pattern dictated by the reticle rotation is performed by scanning the reticle and substrate past a scanning slit. A simplified view of such a scanning function is illustrated in FIG. 8, wherein the die portion 220 on the substrate 214 is moved underneath a scanning slit 304. As can be seen in FIG. 8, as the slit 304 passes over the die 220 in the X-direction, a horizontal portion 306 of the die 220 (e.g., (1,1), (2,1) . . . (5,1)) will be imaged by the same portion of the lens. Thus variations in subsequently measured critical dimensions in the X-direction (e.g., region 306) are not due to the imaging system but rather are due to reticle variations and scanning system errors, as will be discussed in greater detail infra.

Once the pattern is printed at step 302, the critical dimension of the resulting pattern is measured at a plurality of points at step 310. Preferably, the plurality of points correspond to each portion of the grid 312 ((1,1) . . . (5,5)) illustrated in FIG. 8. As discussed supra, the measurement of the pattern may be accomplished using a scanning electron microscope, an optical microscope, or an electrical measurement or other means as desired.

The method 300 of FIG. 7 continues at step 320 wherein a second pattern is formed by scanning the reticle and the substrate past the scanning slit 304 with the reticle being in a second orientation which is different from the first orientation (e.g., 180°). The second pattern is preferably rotationally symmetric to the first pattern and is measured at the same plurality of points as the first pattern at step 322.

The critical dimension data collected for the two patterns (e.g, CD(1,1)$_{0°}$, . . . CD(5,5)$_{0°}$, CD(1,1)$_{180°}$, . . . CD(5,5)$_{180°}$) is then utilized to separate the critical dimension contribution due to the reticle from the critical dimension contribution due to non-reticle factors (e.g., lens contributions and scanning system contributions). This distillation process is performed at step 324 in a manner similar to step 236 of FIG. 4.

Data pairs are taken which contain patterns which are rotationally symmetric to one another (e.g., (1,1) and (5,5) or (2,1) and (4,5) or (1,2) and (5,4), etc.) and the reticle contribution ($R(X_i,Y_j)$) and the non-reticle contribution ($NR(X_i,Y_j)$), for example, for points (1,1) and (5,5) are calculated as follows:

$$CD(1,1)_{0°}=R(1,1)+NR(1,1),$$

$$CD(1,1)_{180°}=R(1,1)+NR(5,5),$$

$$CD(5,5)_{0°}=R(5,5)+NR(5,5),$$

and $$CD(5,5)_{180°}=R(5,5)+NR(1,1).$$

The four equations have four unknowns and thus the unknowns $R(1,1)$, $NR(1,1)$, $R(5,5)$ and $NR(5,5)$ can be determined in a manner similar to that described supra. Since the linear system is degenerate, a single reticle measurement is made at one of the two points (e.g., (1,1) or (5,5)). After obtaining one of the pieces of reticle data via a measurement, the remaining system has three equations and three unknowns in which a unique solution may be found. The above calculations are performed at Step 324 (preferably, by use of a programmed processor and associated memory as well known by those skilled in the art) so that the reticle critical dimension contributions and the non-reticle critical dimension contributions are calculated for all the plurality of points (e.g., $R(1,1)$, ... $R(5,5)$ and $NR(1,1)$, ... $NR(5,5)$).

The collected data may then be utilized to characterize the reticle, for example, in a manner as described supra. The non-reticle critical dimension contribution data may be further evaluated by analyzing data points along a horizontal strip taken along the scan direction such as region 306 at step 326 to identify systematic and non-systematic critical dimension components, for example, due to the lens and the scanning system. For example, since each point in region 306 is imaged with the same portion of the lens, any variation in the critical dimension data is not due to the lens and is thus associated with the scanning system. Therefore the critical dimension components associated with the scanning system may be calculated by:

$$SS(Y=1)=STD(NR(1,1), NR(2,1), NR(3,1), NR(4,1), NR(5,1)),$$

wherein $SS(Y=1)$ represents the scanning system contributions at region 306 and $STD$ represents the standard deviation. Similarly, critical dimension components associated with the lens (the imaging system) may be determined by calculating the average of the non-reticle critical dimension data along a horizontal strip. Therefore the present invention provides for the separate characterization of each scanning system component (e.g., the reticle component, the lens component and the scanning component) which contributes to the critical dimension of patterns formed on the substrate. By identifying each component separately, process developments relating to each component may be easily characterized.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of characterizing a lithographic scanning system, comprising the steps of:

printing a first pattern using a reticle having a first orientation with respect to the lithographic scanning system;

measuring a critical dimension of the first pattern at a plurality of points;

printing a second pattern using the reticle having a second orientation with respect to the lithographic scanning system different than the first orientation;

measuring a critical dimension of the second pattern at the plurality of points;

measuring a critical dimension on the reticle at a plurality of points corresponding to the plurality of points of the first and second patterns;

determining a reticle critical dimension component and a non-reticle critical dimension component of the patterns at the plurality of points; and determining a scanning system critical dimension component of the patterns using the non-reticle critical dimension component data along a plurality of points corresponding to a scanning direction of the lithographic scanning system.

2. The method of claim 1, wherein the second orientation of the reticle is rotated 180 degrees from the first orientation.

3. The method of claim 1, wherein printing the first and second patterns comprises illuminating the reticle with ultraviolet radiation and transferring the reticle pattern to a substrate through an imaging system as the reticle and the substrate are scanned past a slit in the imaging system.

4. The method of claim 1, wherein measuring the critical dimension of the first and second patterns comprises measuring at least one of a width or length dimension of the first and second patterns using a scanning electron microscope or an optical microscope.

5. The method of claim 1, wherein measuring the critical dimension of the first and second patterns comprises:

forcing a current through the first and second patterns;

measuring a voltage across at least a portion of the first and second patterns; and calculating a resistance of the first and second patterns using the forced current and the measured voltage, wherein the resistance is related to the critical dimension of the first and second patterns.

6. A method of characterizing a lithographic scanning system, comprising the steps of:

printing a first pattern using a reticle having a first orientation with respect to the lithographic scanning system;

measuring a critical dimension of the first pattern at a plurality of points;

printing a second pattern using the reticle having a second orientation with respect to the lithographic scanning system different than the first orientation;

measuring a critical dimension of the second pattern at the plurality of points;

measuring a critical dimension on the reticle at a plurality of points corresponding to the plurality of points of the first and second patterns;

determining a reticle critical dimension component and a non-reticle critical dimension component of the patterns at the plurality of points;

wherein determining a non-reticle critical dimension component comprises:

(a) creating four equations with four unknowns using the measured critical dimension data as follows:

$$CD_{(pattern\ 1,\ point\ 1)} = R_{point\ 1} + NR_{point\ 1},$$

$$CD_{(pattern\ 1,\ point\ 2)} = R_{point\ 2} + NR_{point\ 2},$$

$$CD_{(pattern\ 2,\ point\ 1)} = R_{point\ 1} + NR_{point\ 2},$$

$$CD_{(pattern\ 2,\ point\ 2)} = R_{point\ 2} + NR_{point\ 1},$$

wherein CD comprises the measured critical dimension at the two points, NR comprises the non-reticle critical dimension component, and R comprises a reticle critical dimension component;

(b) using the measured reticle critical dimension at the plurality of points to reduce the four equations to a three equation, three unknown linear system;

(c) solving the linear equations to identify the non-reticle critical dimension component of the features at the plurality of points;

(d) repeating steps (a), (b) and (c) until the non-reticle critical dimension components are identified for the plurality of points; and determining a scanning system critical dimension component of the patterns using the non-reticle critical dimension component data along a plurality of points corresponding to a scanning direction of the lithographic scanning system.

7. The method of claim 1, wherein determining a scanning system critical dimension component comprises calculating a standard deviation of the non-reticle critical dimension components of the points along the scanning direction.

8. The method of claim 1, wherein the first and second patterns are rotationally symmetric with respect to one another, thereby ensuring that approximately the same pattern is being measured at the plurality of points.

9. A method of identifying components that make up a critical dimension of a feature in a lithographic scanning system, comprising the steps of:

printing a first pattern onto a substrate using a reticle having a first orientation with respect to the lithographic scanning system, wherein the reticle contains features thereon which are rotationally symmetric about a specified angle of rotation;

measuring a critical dimension of the first pattern at a first plurality of points across the substrate;

rotating the reticle to a second orientation with respect to the lithographic scanning system different than the first orientation, wherein an angle between the first and second orientation is equal to the specified angle;

printing a second pattern onto another substrate using the reticle at the second orientation;

measuring a critical dimension of the second pattern at a second plurality of points across the another substrate, wherein the first and second plurality of points positionally correspond to one another;

measuring a critical dimension on the reticle at a plurality of points corresponding to one of the first and second plurality of points;

determining a reticle critical dimension component and a non-reticle critical dimension component at the first and second plurality of points using the measured critical dimension data at the first and second plurality of points; and determining a scanning system critical dimension using the non-reticle critical dimension component along a plurality of points corresponding to a scanning direction of the lithographic scanning system.

* * * * *